United States Patent [19]
Seshadri et al.

[11] Patent Number: 6,103,561
[45] Date of Patent: Aug. 15, 2000

[54] DEPLETION MODE MOS CAPACITOR WITH PATTERNED $V_T$ IMPLANTS

[75] Inventors: Anand Seshadri, Plano; Bob Strong, Sachse, both of Tex.

[73] Assignee: Texas Instruments Incorporated, Dallas, Tex.

[21] Appl. No.: 09/271,982

[22] Filed: Mar. 19, 1999

Related U.S. Application Data

[62] Division of application No. 08/947,209, Oct. 8, 1997, Pat. No. 5,986,314
[60] Provisional application No. 60/028,030, Oct. 8, 1996.

[51] Int. Cl.[7] .............................................. H01L 21/8238
[52] U.S. Cl. .................... 438/210; 438/548; 438/549; 438/217; 438/241; 438/250; 438/251; 438/275; 438/276; 438/289
[58] Field of Search ..................................... 438/238, 239, 438/241, 250, 251, 252, 210, 217, 275, 276, 289, 548, 549, 253, 254, 255, 256

[56] References Cited

U.S. PATENT DOCUMENTS

| | | | |
|---|---|---|---|
| 4,131,983 | 1/1979 | Matzen | 438/258 |
| 4,696,092 | 9/1987 | Doering et al. | 438/210 |
| 4,950,617 | 8/1990 | Kumagai et al. | 438/275 |
| 5,071,784 | 12/1991 | Takeuchi et al. | 438/241 |
| 5,238,860 | 8/1993 | Sawada et al. | 438/210 |
| 5,484,739 | 1/1996 | Lee et al. | 438/231 |
| 5,736,415 | 4/1998 | Chang et al. | 438/217 |

*Primary Examiner*—David Hardy
*Assistant Examiner*—N. Drew Richards
*Attorney, Agent, or Firm*—Mark A. Valetti; Wade James Brady, III; Frederick J. Telecky, Jr.

[57] ABSTRACT

A method for making a memory cell (10) in a process in which both an n-channel MOS transistors (12) and a p-channel transistor (44) are formed in a semiconductor substrate (30) is presented. The method includes implanting an impurity (40) into a region of the substrate (30) to form a part of a depletion NMOS memory capacitor (21) to be associated with the n-channel MOS memory transistor (12). The implant is performed concurrently with a patterned implant with the same impurity to adjust the threshold and punch-through of the p-channel transistor (44).

6 Claims, 10 Drawing Sheets

DEPLETION MODE MOS CAPACITOR WITH PATTERNED $V_T$ IMPLANTS

CROSS REFERENCE TO PRIOR APPLICATIONS

This application is a division of Ser. No. 08/947,209, filed Oct. 8, 1997 now U.S. Pat. No. 5,986,314 which claims priority based upon Provisional Application Ser. No. 60/028,030, filed Oct. 8, 1996.

BACKGROUND OF THE INVENTION

1. Field of the Invention

This invention relates to improvements in semiconductor fabrication techniques and devices made thereby, and, more particularly, to improvements in methods for making depletion NMOS capacitors in logic processes in which embedded DRAM logic devices are formed.

2. Relevant Background

With increasing integration of multiple integrated circuit functions onto a single semiconductor chip, the need for smaller memory cells to embed in logic processes has arisen. A 1T-LC DRAM cell is presently regarded as the cell of choice for embedding, due to its small size. Typically the DRAM cell is implemented in a single polysilicon, double metal Logic CMOS process using a planar MOS capacitor. The capacitor may be an NMOS or a PMOS capacitor in the enhancement or depletion mode. In fact, enhancement mode capacitors already exist in many known CMOS processes.

In an NMOS cell with an enhancement capacitor, the field-plate is connected to $V_{DD}$ and $P_{sub}$ is connected to ground to create an inversion layer to store the charge. The amount of charge that may be stored in such an enhancement capacitor is reduced, since the inversion layer disappears for storage node voltage above $V_{DD}$-$V_T$ ($V_T$ is the threshold voltage of the capacitor). This situation arises for a dual-gate oxide cell, in which the pass gate can be at a higher bias ($V_{PP}$) than the capacitor plate ($V_{DD}$). Thus, maximum possible charge storage is achieved by a depletion capacitor which maintains an inversion layer, even at storage node is $V_{DD}$. Since charge stored per unit area of capacitor is increased significantly, allowing reduction in capacitor area and cell size. Another concern with an NMOS enhancement mode storage capacitor is that the voltage slew that may occur on power supplies changes the amount of charge stored in the cell, which may result in an erroneous read. By using a depletion mode capacitor, the field plate may be connected to ground for an NMOS capacitor. Since the field plate and the capacitor substrate are then connected to the same power supply, there is no change in charge stored, even with voltage slew. However, implementing a depletion mode capacitor may require an additional pattern and implant step, so that only the depletion capacitor receives the depletion implant. This adds to cost and complexity of the process.

SUMMARY OF THE INVENTION

In view of the above, therefore, it is an object of the invention to provide a depletion layer implant for a capacitor in a memory cell, without requiring extra masks or extra implant steps, from the masks and steps used in an ordinary memory cell construction processes.

This and other objects, features and advantages of the invention will be apparent to those skilled in the art from the following detailed description of the invention, when read in conjunction with the accompanying drawings and appended claims.

Using a depletion NMOS capacitor, charge stored per unit area of capacitor is increased significantly, which allows reduction in capacitor area and cell size. Moreover, voltage slew on the field plate does not affect the charge stored in the capacitor. According to a preferred embodiment of the invention, the depletion NMOS capacitor is implemented without requiring additional process steps, since it can be implemented using existing $V_{TN}$ and $V_{TP}$ process steps.

Thus, according to a broad aspect of the invention, a method is presented for making a memory cell in a process in which MOS transistors of opposite conductivity type are formed in a substrate. The method includes implanting an impurity into a region of a semiconductor substrate for a part of a memory capacitor to be associated with a memory transistor of first conductivity type. Concurrently a threshold adjusting implant is performed with the same impurity for another transistor of second conductivity type in the substrate.

According to another broad aspect of the invention, a method is presented for making a depletion capacitor for a memory cell. The method includes implanting a threshold adjusting impurity for an MOS transistor in a semiconductor substrate. Concurrently a region of the substrate for a part of a memory capacitor is implanted with the threshold adjusting impurity.

According to yet another broad aspect of the invention, a memory cell is presented. The memory cell includes a first MOS transistor of first conductivity type, having a threshold adjusting and punch-through suppressing impurity having an impurity type and concentration in a channel region of the first MOS transistor in a semiconductor substrate. A depletion capacitor in provided, which includes an impurity in the substrate of the same impurity type and concentration as the threshold adjusting and punch-through suppressing impurity. The threshold adjusting impurity and depletion capacitor implant can be formed by simultaneous implants, if desired. A second MOS transistor of second conductivity type is associated with the depletion capacitor.

BRIEF DESCRIPTION OF THE DRAWINGS

The invention is illustrated in the accompanying drawings, in which.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Figure 1:
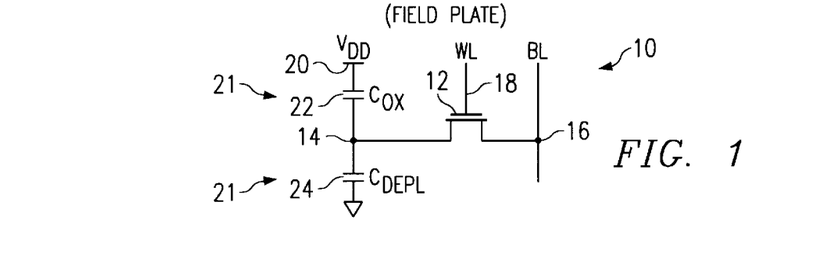
FIG. 1 is an electrical schematic diagram of a memory cell in which the method and apparatus of the present invention is incorporated.

With reference first to FIG. 1, a memory cell 10 is shown that includes an NMOS transistor 12 connected on one side to a memory node 14 and on the other side to a bit line 16. The gate of the memory transistor 12 is connected to the wordline 18. The memory capacitor 21 associated with the memory cell 10 includes two capacitive components. The first capacitive component is to the field plate 20 which is separated from the memory node 14 by an oxide. The capacitive component is denoted by the capacitor 22 in the schematic of FIG. 1. The second capacitive component exists between the memory node 14 and the substrate and is provided by a depletion region in the semiconductor substrate. This capacitive component is indicated by the capacitor 24 in the electrical schematic diagram of FIG. 1.

Figure 2:
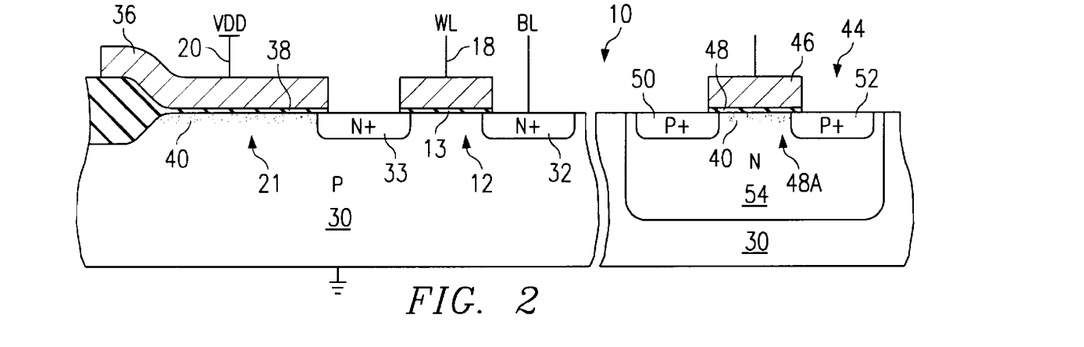
FIG. 2 is a side elevation cross-sectional view of a portion of an integrated circuit showing the construction of a memory cell in accordance with a preferred embodiment of the invention.

A side elevational cross-sectional view of a memory cell constructed in accordance with a preferred embodiment of the invention is shown in FIG. 2. The memory cell 10 is constructed in a semiconductor substrate 30 of P conductivity type. The substrate 30 may be, for example, of conventional construction, including a layer of P type boron doped epitaxially formed silicon of <100> orientation, of thickness of about 6.5±0.7 $\mu$m and resistivity between 11 and 15 ohm-cm. The epi layer may be formed, for example, on a boron doped P type silicon substrate of <100> orientation, having a thickness of about 600 $\mu$m and resistivity of between about 0.01–0.02 ohm-cm. An NMOS memory transistor 12 is formed in the epi layer, with an n-channel 13 between source/drain regions 32 and 33. The memory capacitor 21 is provided adjacent the NMOS transistor 12 between a supply voltage, $V_{DD}$ 20 and ground.

The memory capacitor 21 is formed between a field plate layer 36 and the n layer 40, with an oxide layer 38 therebetween. Additionally, a depletion region exists between the n layer 40 and the body of the substrate 30 to add further capacitance to the memory capacitor. As will become apparent, the impurities in the n layer 40 are of the same concentration and type as the impurity of the punchthrough and threshold setting implant of the p-channel transistor 44 constructed elsewhere on the substrate 30.

Thus, the PMOS transistor 44, which may be constructed in usual manner, including a gate 46 separated by an oxide layer 48 from an underlying channel region 48A. The channel region 48A is between source/drain regions 50 and 52. The entire device 44 is constructed in an N well 54 in the substrate 30. Since the PMOS transistor 44 is constructed in conventional manner, the phosphorous implant of the punchthrough and threshold setting impurity 40 is performed by an existing implant mask, described below in detail. Additionally, the same phosphorus implant is implanted, using a modified mask in the substrate region of the capacitor 21, resulting in an implant in the two regions having the same impurity type and concentration. The implant may be, for example, of phosphorus to result in a concentration of about $1^{17}$/cm$^3$ at the surface, with a junction depth of about 0.3 $\mu$m, for the capacitor.

Figure 3:
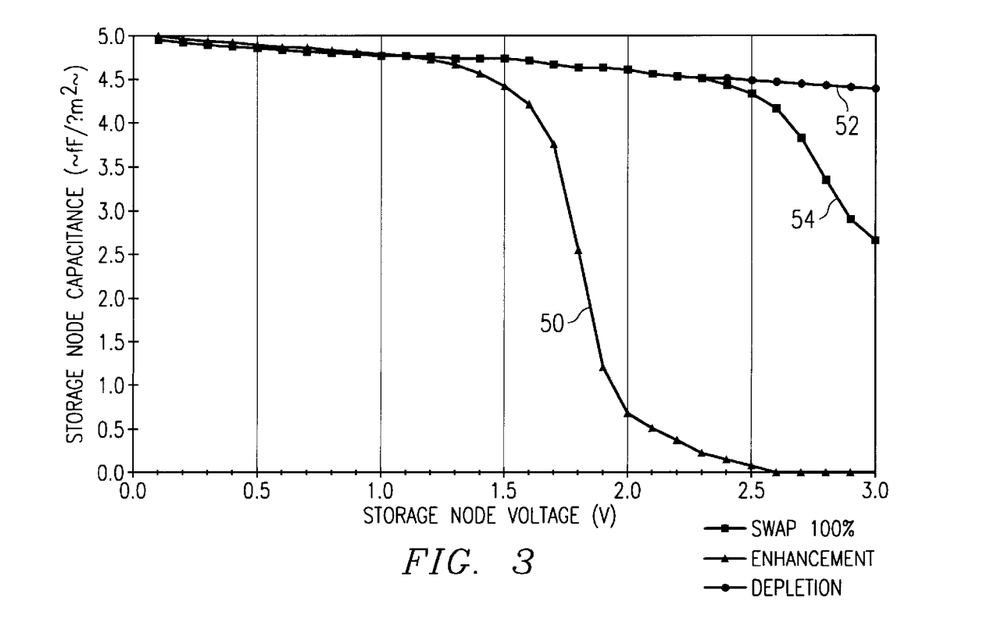
FIG. 3 is a graph showing the relationship of storage node voltage to capacitance from the storage node to the overlying field plate and underlying substrate for enhancement, proposed depletion, and typical depletion memory capacitor implantation techniques.

With reference now to FIG. 3, typically a memory capacitor is implanted with a dopant which results in the production of an enhancement capacitor. The change in capacitance with respect to storage node voltage is shown by curve 50. It has been proposed to implant, in a separate step, the substrate portion of the capacitor with a dopant to produce a so-called depletion capacitor, the resulting capacitance versus voltage characteristic being shown by the curve 52.

Finally, if the substrate is implanted with the same dopant as a PMOS transistor, according to the invention, a capacitance versus storage node voltage characteristic illustrated by the curve 54 is achieved. It can be seen that up to a voltage of about 2.4 volts, there is virtually no difference in the capacitance vs. Voltage for curves 52 and 54, and up to a voltage of about 3.0 volts, the charge stored for curve 54 is about 1.5 times that achieved by the enhancement implant of curve 50. Consequently, through the use of the concurrent implant into both the PMOS device and the depletion capacitor, significant improvement in the capacitance vs. voltage characteristics of the depletion capacitor are achieved, requiring only modification the threshold implant mask for the PMOS and NMOS devices.

It will be appreciated that depending upon the process used in making the integrated circuit that will contain the memory cell, the threshold, punchthrough, and depletion capacitor implant dosages and implant energies may need to be modified from the dosages and energies of the embodiment described herein. The goal, of course, is to accomplish the depletion capacitor of desired characteristics in a process in which normal threshold and punchthrough implants are used, so that the same implant may be simultaneously uses for all of the implants.

Figure 4:
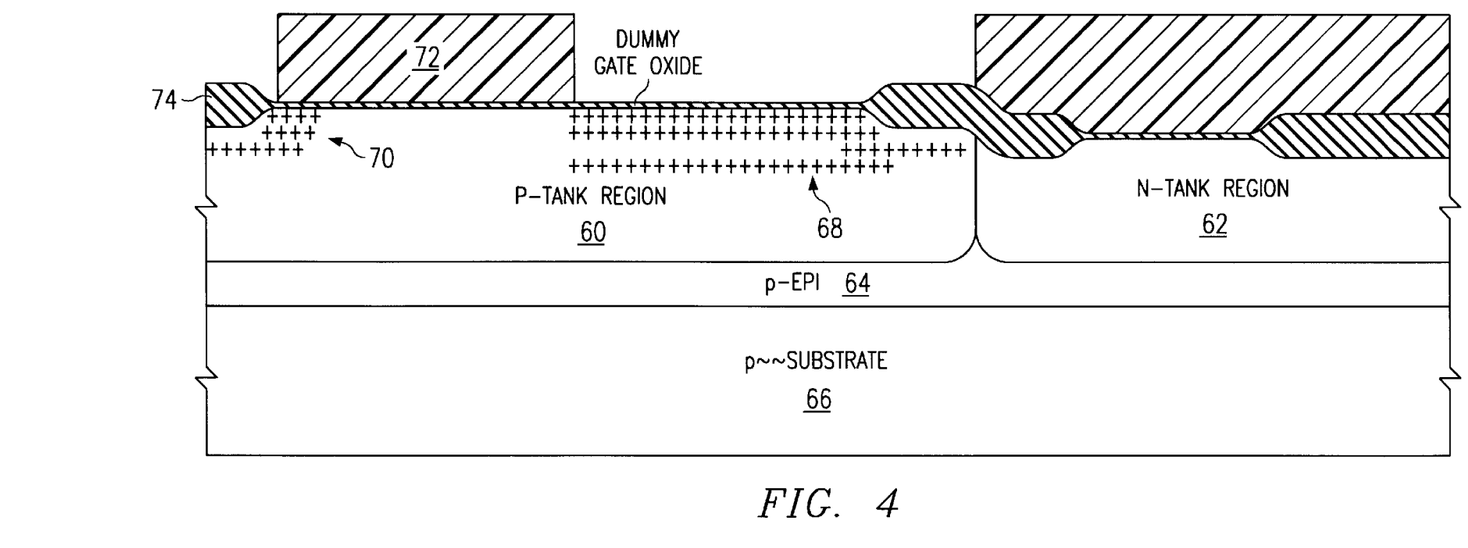
FIGS. 4–12 are side elevation cross-sectional views of the various fabrication steps in the formation of the depletion capacitor, in accordance with a preferred embodiment of the invention. The various cross-sectional views are not necessarily drawn to the same scale In the various figures of the drawing, like reference numerals are used to denote like or similar parts.

The process by which the depletion capacitor may be constructed is illustrated in FIGS. 4–12, to which reference is now additionally made. The stage of construction at which the formation of the depletion capacitor commences is shown in FIG. 4. A P tank region 60 in which the n-channel device will be formed and an N tank region 62 in which the p-channel device will be formed are formed in a P epitaxial layer 64 on a P type substrate 66. The punchthrough and threshold implants 68 of the n-channel device, as well as the channel stop implants 70, have been patterned by a photoresist mask 72 and the previously formed field oxide regions 74.

Figure 5:
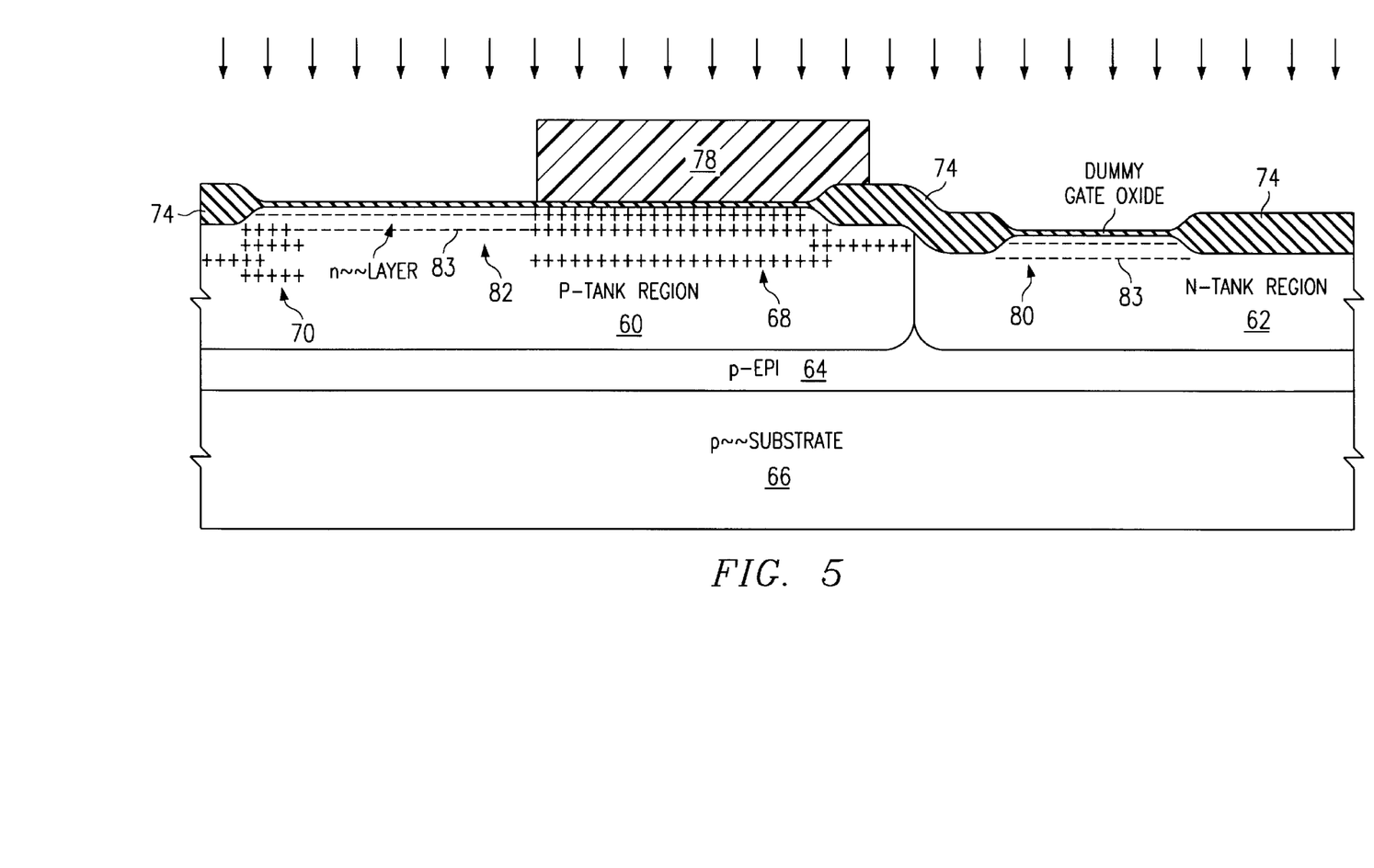

The photoresist mask 72 is then removed, and a photoresist mask 78 is formed, as shown in FIG. 5, for the simultaneous implants 83 for setting the threshold of the p-channel device, providing punchthrough protection for the p-channel device, and establishing the depletion capacitor. Thus, the photoresist mask 78 is patterned to expose the channel region 80 of the p-channel device (in part masked by the adjacent field oxide regions), as well as the substrate region 82 of the depletion capacitor. The threshold implant 83 may be performed to implant phosphorus at an energy of about 50 KeV and concentration of about $4 \times 10^{12}$/cm$^2$. The punchthrough implant may be performed to implant phosphorus at an energy of about 150 KeV and dose of about $3 \times 10^2$/cm$^2$. The photoresist mask 78 is then removed.

Figure 6:
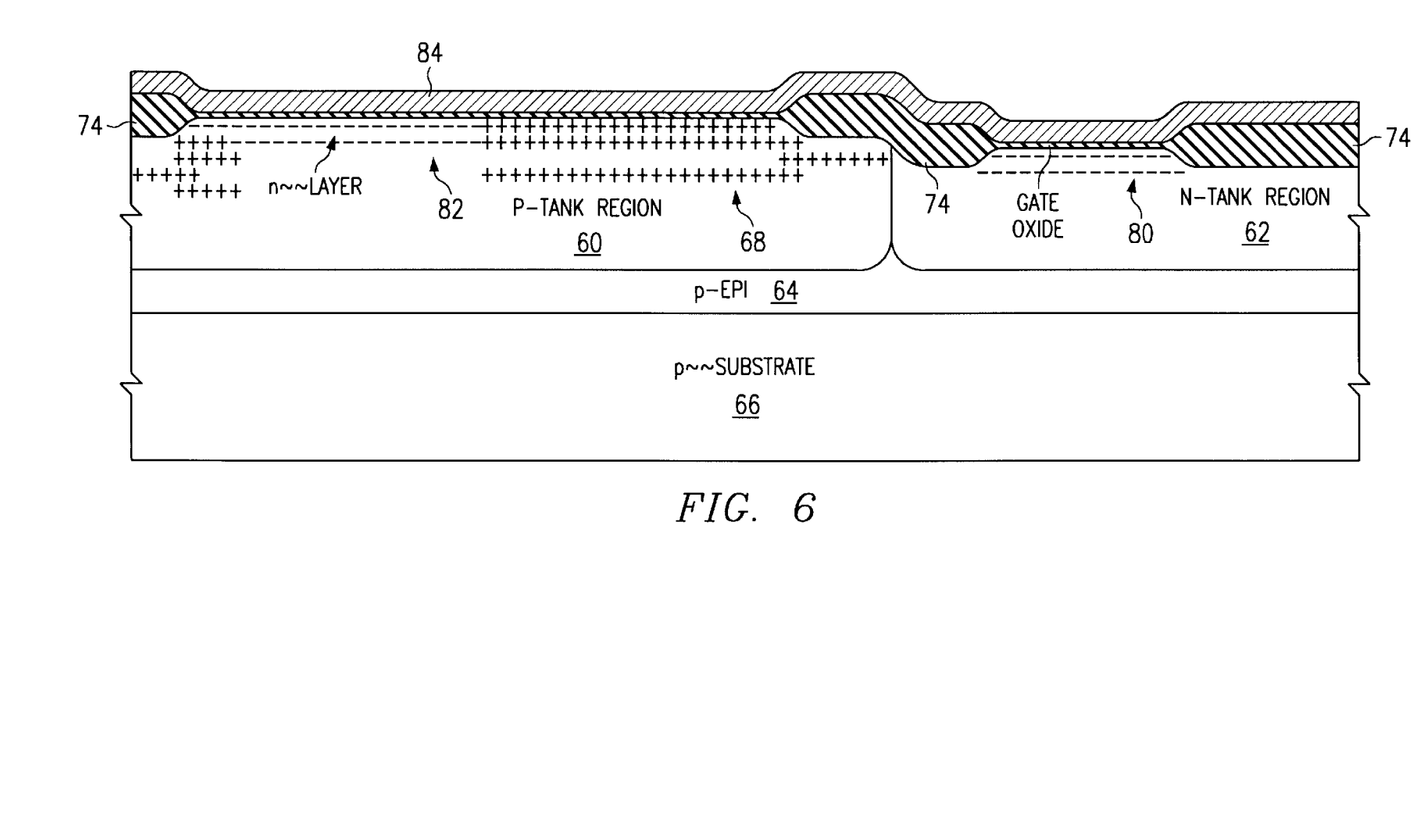
Figure 7:
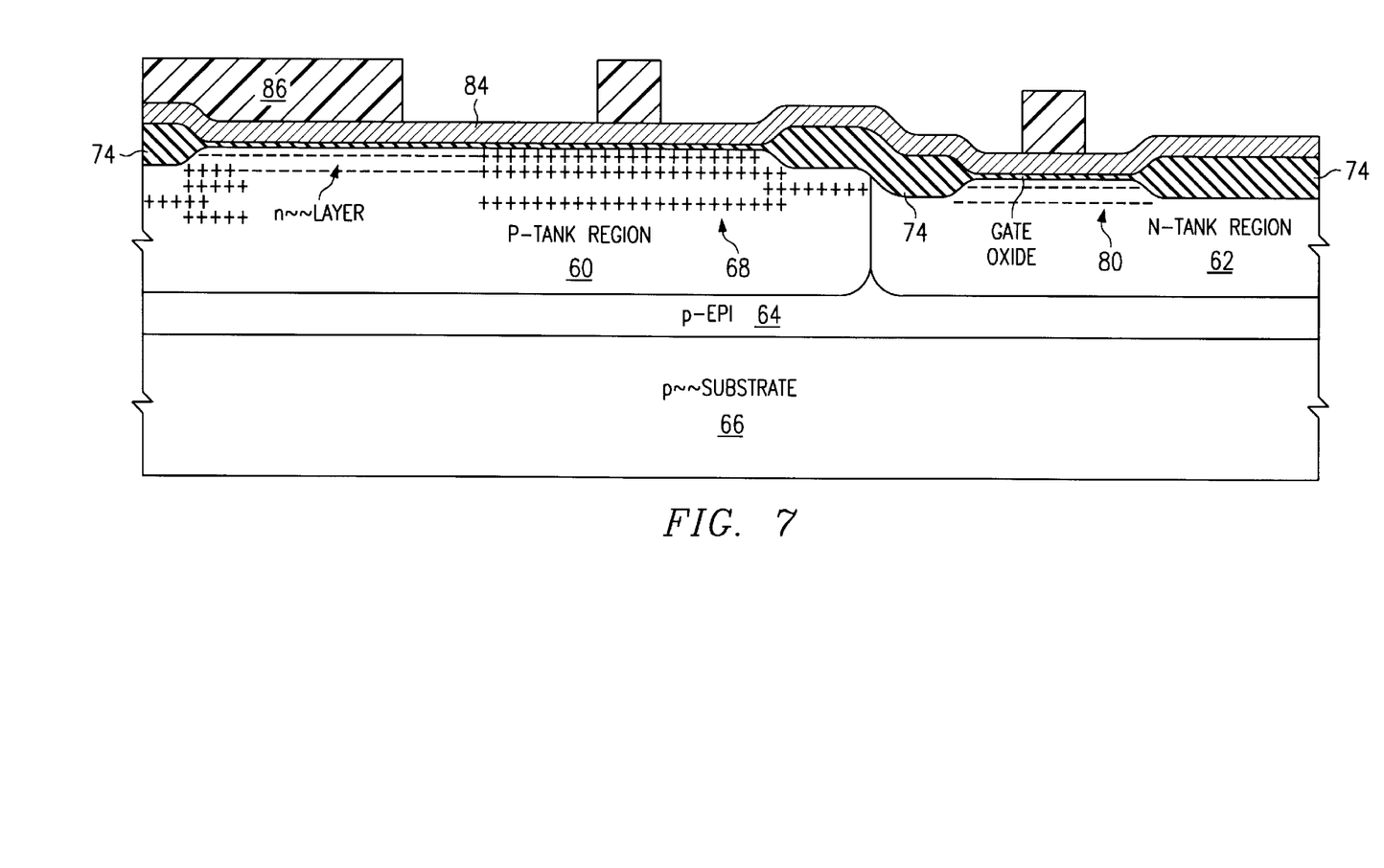

As shown in FIG. 6, a gate oxide layer is formed with a thickness of about 80Å, and a polysilicon layer 84 is then formed overall to a thickness of about 3100Å. As shown in FIG. 7, a photoresist mask 86 is formed and patterned to enable exposed regions of the polysilicon layer 84 to 86 patterned to provide the gate regions 85 and 87, respectively for the n-channel device and the p-channel device, and to provide the top plate 89 for the depletion capacitor. The mask 86 is then removed.

Figure 8:
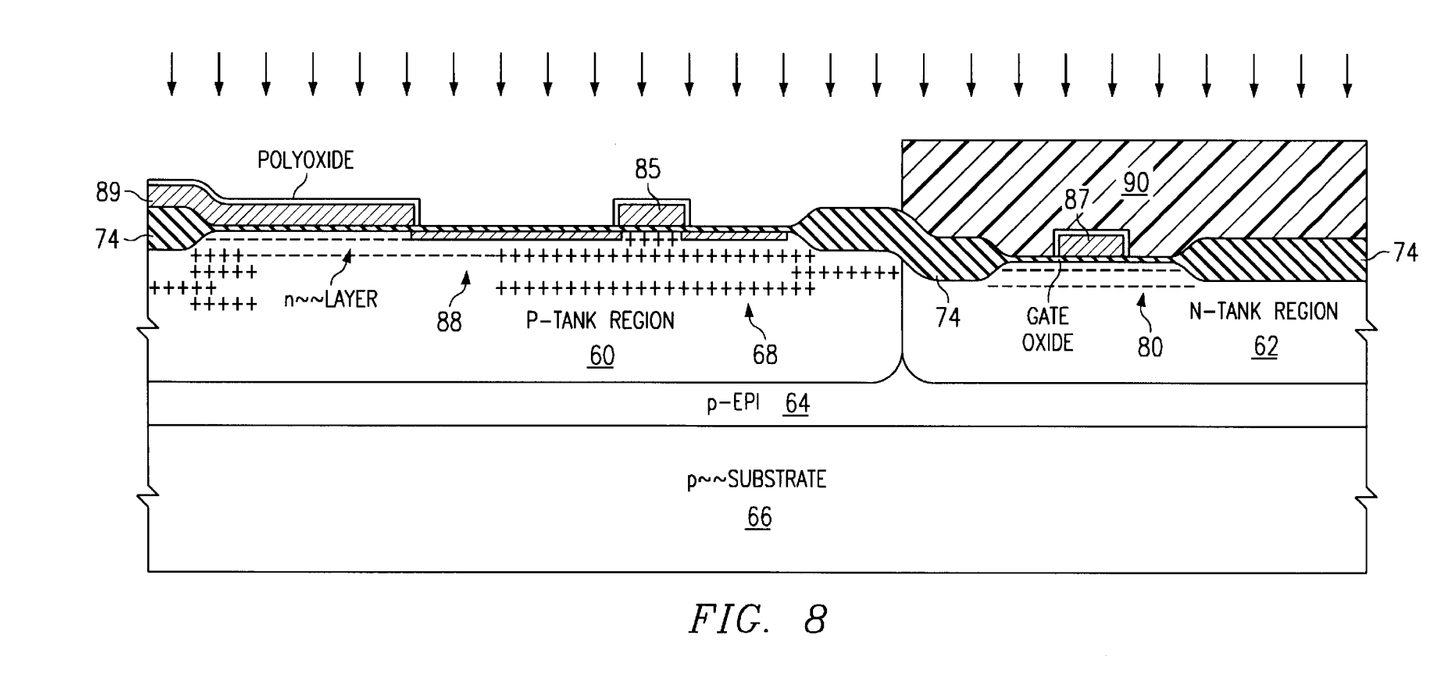
Figure 9:
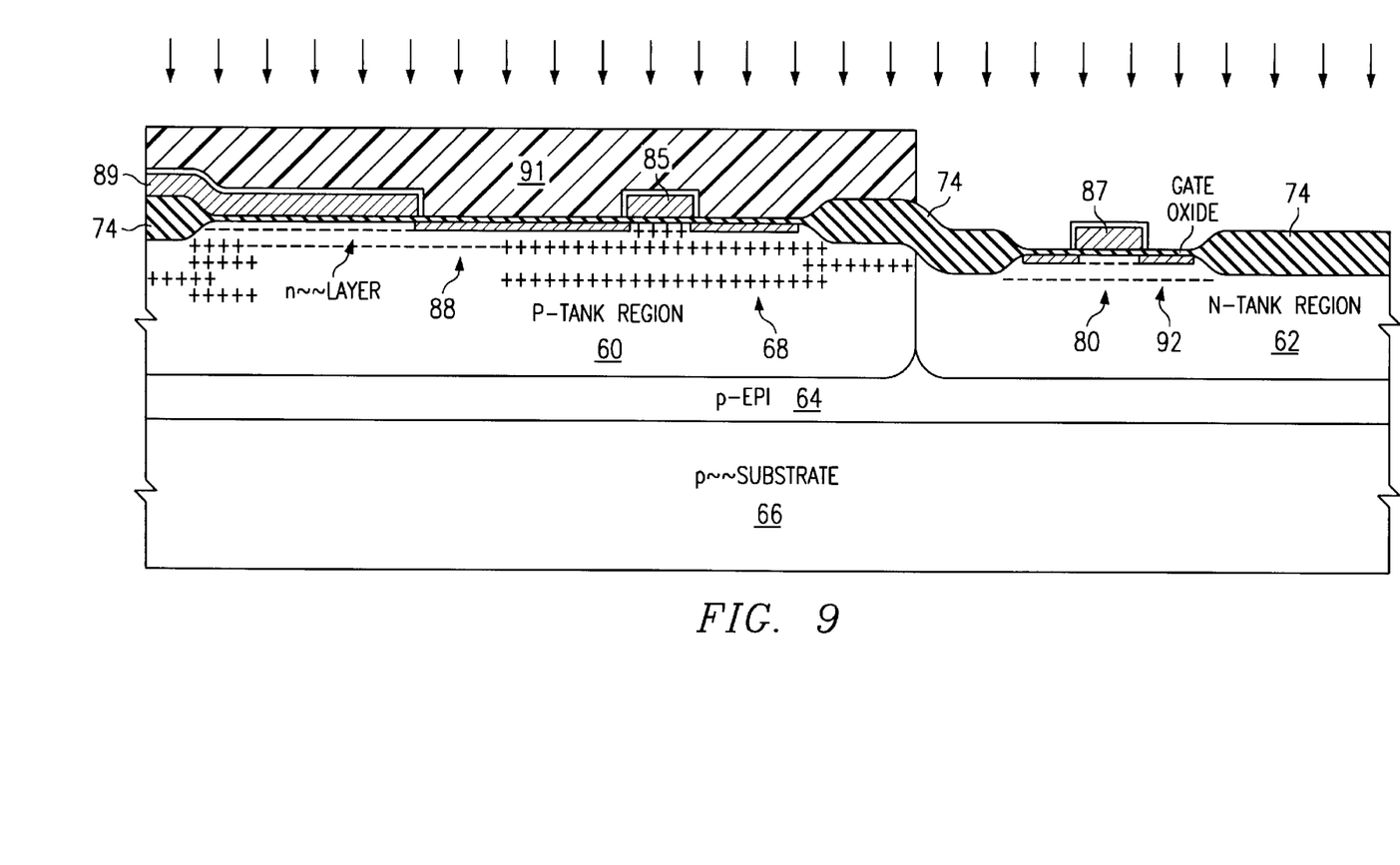

As shown in FIG. 8, a polysilicon mask 90 is formed over the p-channel device region to enable the lightly doped drain implants 88 for the n-channel device to be formed. In a similar fashion, as shown in FIG. 9, a photoresist mask 91 is formed and patterned over the n-channel device and depletion capacitor regions, and lightly doped drain implant 92 for the p-channel device is formed. The mask 91 is then removed.

Figure 10:
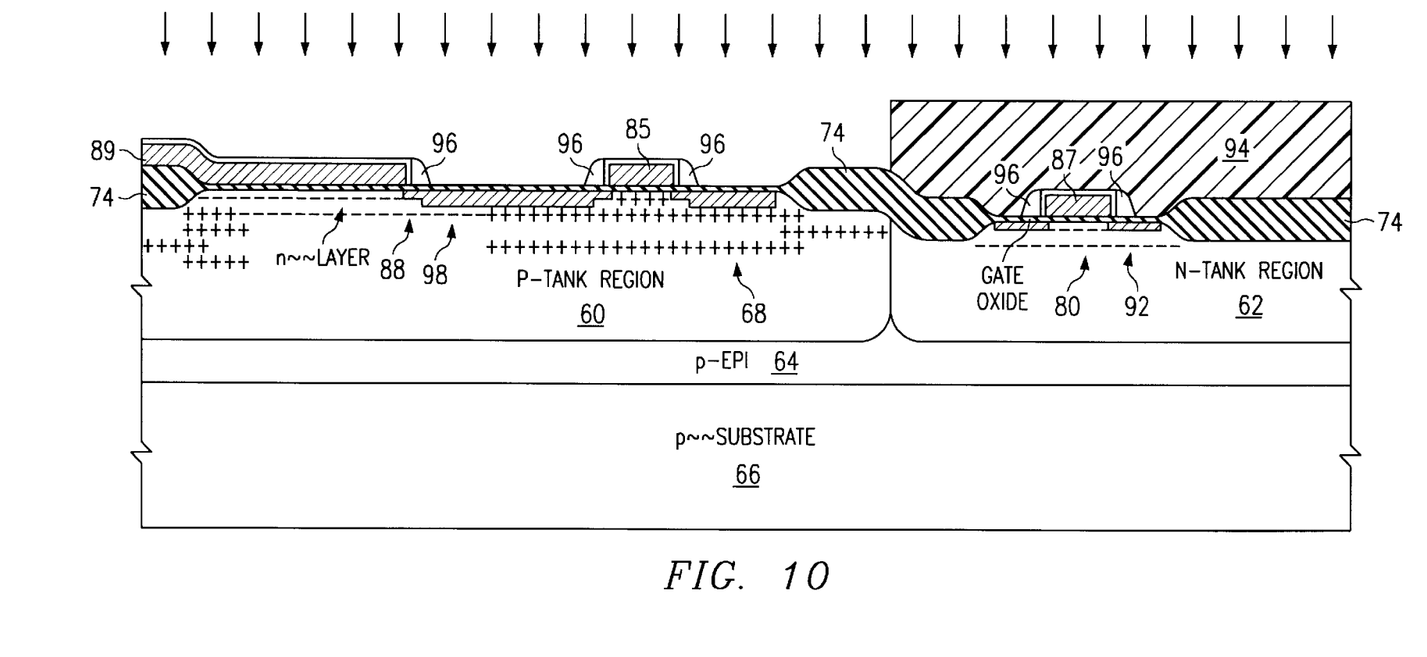

Next, as shown in FIG. 10, sidewall oxide 96 is formed on the sidewalls of polysilicon layers 85, 87, and 89, a photoresist mask 94 is formed and patterned, and the source/drain region implants 98 are formed for the n-channel device. The source/drain implants may be, for example, of phosphorus with an energy of about 50 KeV with a concentration of about $4 \times 10^{14}/cm^2$, followed by an implant of arsenic with an energy of about 120 KeV with a concentration of about $3 \times 10^{15}/cm^2$. The mask 94 is then removed.

Figure 11:
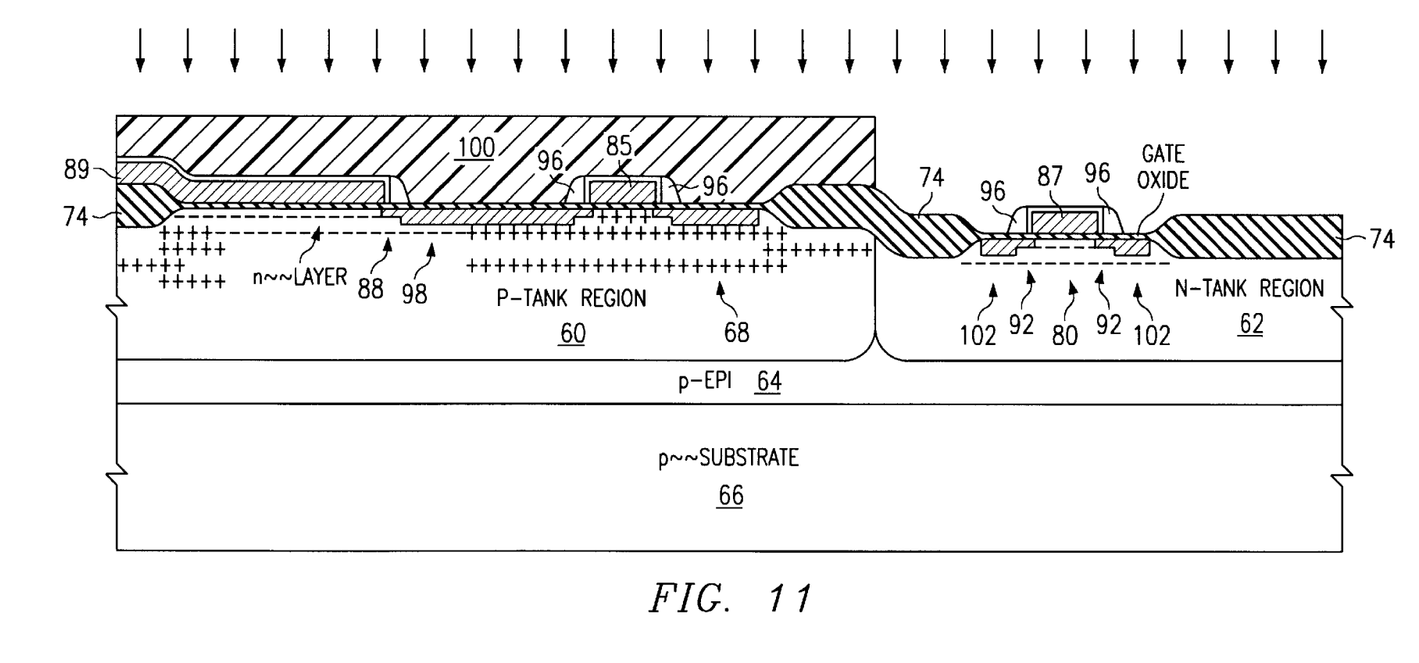

Similarly, as shown in FIG. 11, a photoresist mask 100 is formed and patterned, and the source/drain region implants 102 are formed for the p-channel device. The source/drain implant may be, for example, of boron with an energy of about 20 KeV with a concentration of about $2 \times 10^{17}/cm^2$. The mask 100 is then removed.

Figure 12:
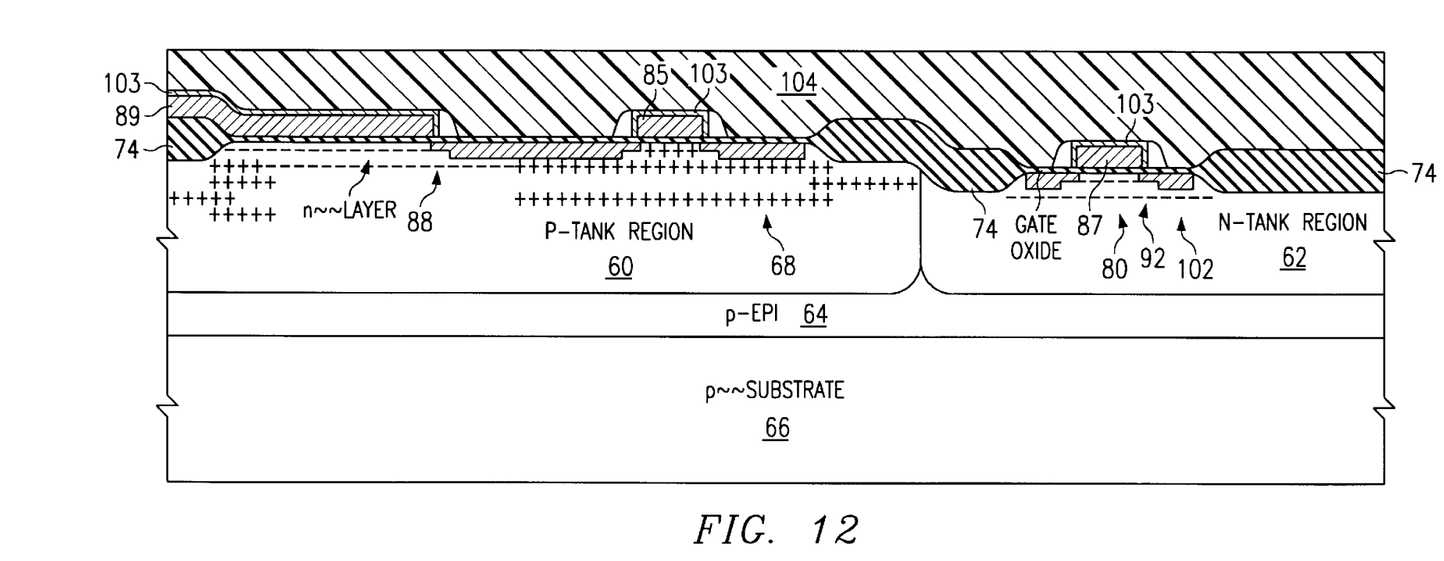

Finally, as shown in FIG. 12, a layer of salicide 103 is formed on the upper surfaces of the polysilicon regions 85, 87, and 89, as well as the gate and source/drain regions of the n-channel and p-channel devices to enable conductive contacts to be made thereto. A layer of TEOS 104 is formed overall, and after appropriate anneal steps, contacts are formed to the various device structures, in known manner.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method of making a memory cell in a process in which MOS transistors of opposite conductivity type are formed in a substrate, comprising the steps of:

providing a semiconductor substrate;

implanting an impurity into a region of said semiconductor substrate for formation of a part of a memory capacitor coupled to a transistor of first conductivity type; and concurrently with said step of implanting, performing a threshold adjusting and punch-through suppressing implant with said impurity for another transistor of second conductivity type different from said first conductivity type in said substrate.

2. The method of claim 1 wherein said transistor of first conductivity type is an n-channel transistor, and said another transistor is a p-channel device.

3. The method of claim 1 wherein said step of implanting is performed by implanting phosphorous into said substrate for formation of said part of said memory capacitor and to provide said threshold adjusting and punch-through suppressing implant for said another transistor.

4. A method for making a depletion capacitor for a memory cell, comprising the steps of:

implanting a threshold adjusting and punch-through suppressing impurity for an MOS transistor in a semiconductor substrate; and concurrently implanting a region of said substrate for a part of a memory capacitor with said threshold adjusting and punch-through suppressing impurity.

5. The method of claim 4 wherein said MOS transistor is a p-channel device.

6. The method of claim 4 wherein said step of implanting a threshold adjusting and punch-through suppressing impurity comprises the step of implanting phosphorus for said MOS transistor and for said memory capacitor.

* * * * *